US009448271B2

(12) United States Patent
Yan et al.

(10) Patent No.: US 9,448,271 B2
(45) Date of Patent: Sep. 20, 2016

(54) DIAGNOSTICS FOR SYSTEMS INCLUDING VARIABLE FREQUENCY MOTOR DRIVES

(71) Applicant: Trane International Inc., Piscataway, NJ (US)

(72) Inventors: Chuan Yan, Tyler, TX (US); Raymond Walter Rite, Tyler, TX (US); William David Daugherty, III, Gladewater, TX (US)

(73) Assignee: Trane International Inc., Piscataway, NJ (US)

( * ) Notice: Subject to any disclaimer, the term of this patent is extended or adjusted under 35 U.S.C. 154(b) by 194 days.

(21) Appl. No.: 14/479,485

(22) Filed: Sep. 8, 2014

(65) Prior Publication Data

US 2015/0070047 A1    Mar. 12, 2015

Related U.S. Application Data

(60) Provisional application No. 61/874,912, filed on Sep. 6, 2013.

(51) Int. Cl.
*G01R 31/34* (2006.01)
*G01R 31/02* (2006.01)
(Continued)

(52) U.S. Cl.
CPC ............ *G01R 31/024* (2013.01); *G01R 31/04* (2013.01); *G01R 31/343* (2013.01); *G01R 31/42* (2013.01); *H02M 1/4225* (2013.01); *H02M 7/53875* (2013.01); *H02M 2001/007* (2013.01); *Y02B 70/126* (2013.01)

(58) Field of Classification Search
CPC .. G01R 31/34; G01R 31/024; G01R 31/343; G01R 31/346; G01R 31/006; G01R 31/025; G01R 31/42; G01R 5/20; G01R 11/36; G01R 11/48; G01P 3/44; G01P 3/495; H02P 23/14; H02P 6/18
USPC ............... 324/765.01, 139, 143, 772, 96
See application file for complete search history.

(56) References Cited

U.S. PATENT DOCUMENTS 4,420,718 A * 12/1983 Sakai ................. H02P 27/06
                                                          318/729
4,612,638 A    9/1986 Kissel
(Continued)

FOREIGN PATENT DOCUMENTS

JP    2005160136    6/2005

OTHER PUBLICATIONS

International Search Report and Written Opinion, ISAKR, PCT/US14/054517, Dec. 11, 2014, 11 pgs.

*Primary Examiner* — Tung X Nguyen
*Assistant Examiner* — Thang Le
(74) *Attorney, Agent, or Firm* — Taft Stettinius & Hollister LLP

(57) ABSTRACT

One embodiment is a diagnostic method for a system including setting a first diagnostic code based upon a condition of a DC bus of a variable frequency drive during a first drive state, setting at least one additional diagnostic code based upon a condition of at least one motor phase current during a second drive state, outputting first diagnostic information indicating a malfunction of the variable frequency drive if the first diagnostic code indicates a first error, and outputting second diagnostic information indicating a malfunction of a motor or a connector coupling the motor and the drive if the at least one additional diagnostic code indicates a second error.

23 Claims, 3 Drawing Sheets

(51) Int. Cl.
*G01R 31/42* (2006.01)
*G01R 31/04* (2006.01)
*H02M 1/42* (2007.01)
*H02M 7/5387* (2007.01)
*H02M 1/00* (2006.01)

(56) References Cited

U.S. PATENT DOCUMENTS

| | | | |
|---|---|---|---|
| 6,097,165 A * | 8/2000 | Herron | B66B 1/32 188/162 |
| 6,150,776 A * | 11/2000 | Potter | H02P 1/30 318/139 |
| 6,160,414 A | 12/2000 | Matsubara et al. | |
| 6,433,504 B1 | 8/2002 | Branecky | |
| 7,516,044 B2 | 4/2009 | Engle | |
| 7,748,225 B2 | 7/2010 | Butler et al. | |
| 7,759,888 B2 | 7/2010 | Matsui et al. | |
| 7,841,583 B1 * | 11/2010 | Kureck | B66D 1/48 254/267 |
| 7,948,721 B2 * | 5/2011 | Brunner | H02P 29/028 318/503 |
| 8,421,398 B2 * | 4/2013 | Fisher | H02P 27/04 318/729 |
| 8,779,698 B2 * | 7/2014 | Havard | F04D 27/004 318/3 |
| 2002/0097065 A1 * | 7/2002 | Krahn | G01R 31/343 324/765.01 |
| 2007/0103006 A1 | 5/2007 | Zushi et al. | |
| 2008/0211439 A1 | 9/2008 | Yokota et al. | |
| 2008/0265819 A1 | 10/2008 | Chen et al. | |
| 2009/0140745 A1 | 6/2009 | Williams et al. | |
| 2010/0293397 A1 | 11/2010 | Pham et al. | |
| 2010/0295492 A1 | 11/2010 | Chakrabarti et al. | |
| 2011/0031911 A1 * | 2/2011 | Marcinkiewicz | H02M 1/4225 318/400.3 |
| 2012/0217920 A1 | 8/2012 | Singh et al. | |

* cited by examiner

DIAGNOSTICS FOR SYSTEMS INCLUDING VARIABLE FREQUENCY MOTOR DRIVES

CROSS REFERENCE

The present application claims the benefit of U.S. Application No. 61/874,912 field Sep. 6, 2013 and the same is hereby incorporated by reference.

BACKGROUND

The present application relates generally to diagnostics for systems including a variable frequency drive configured to drive a motor. Variable frequency drives, sometimes referred to as a variable speed drives, may be utilized in connection with a variety of systems including HVACR systems such as air conditioning systems, heat pump systems and other refrigeration systems, air compressor systems, and other compressor drive systems. In such systems, variable frequency drives may be utilized to electrically drive motors that are, in turn, structured to drive a number of different mechanical loads including, for example, refrigerant compressors, condenser fans, cooling fans, air compressors and other types of fans and compressors. Utilization of variable frequency drives in such applications offers a number of benefits including those respecting energy efficiency and operational cost. Yet the presence of variable frequency drives presents additional potential failure modes. It can be complex, time consuming and expensive for a service technician to adequately diagnose such systems. Inadequate diagnostics may result in unnecessary replacement of functioning system components, repeated service events, or other undesirable service and maintenance complications. There remains a significant need for enhancements to diagnostics for such systems.

DISCLOSURE

For the purposes of clearly, concisely and exactly describing exemplary embodiments of the invention, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the invention is thereby created, and that the invention includes and protects such alterations, modifications, and further applications of the exemplary embodiments as would occur to one skilled in the art.

SUMMARY

Unique diagnostics for systems including a variable frequency drive are disclosed. One embodiment is a system including a controller structured to perform system diagnostics. The controller may be structured to set a first diagnostic code based upon a condition of a DC bus of a variable frequency drive during a first drive state, and set at least one additional diagnostic code based upon a condition of at least one motor phase current during a second drive state. First diagnostic information indicating a malfunction of the variable frequency drive may be output if the first diagnostic code indicates a first error. Second diagnostic information indicating a malfunction of a motor or a connector coupling the motor and the drive may be output if the at least one additional diagnostic code indicates a second error. Other embodiments include apparatuses, systems, devices, hardware, methods, and combinations including unique diagnostics for systems including a variable frequency drive. Further embodiments, forms, features, aspects, benefits, and advantages of the present application will become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION

Figures 1, 2A, 2B:
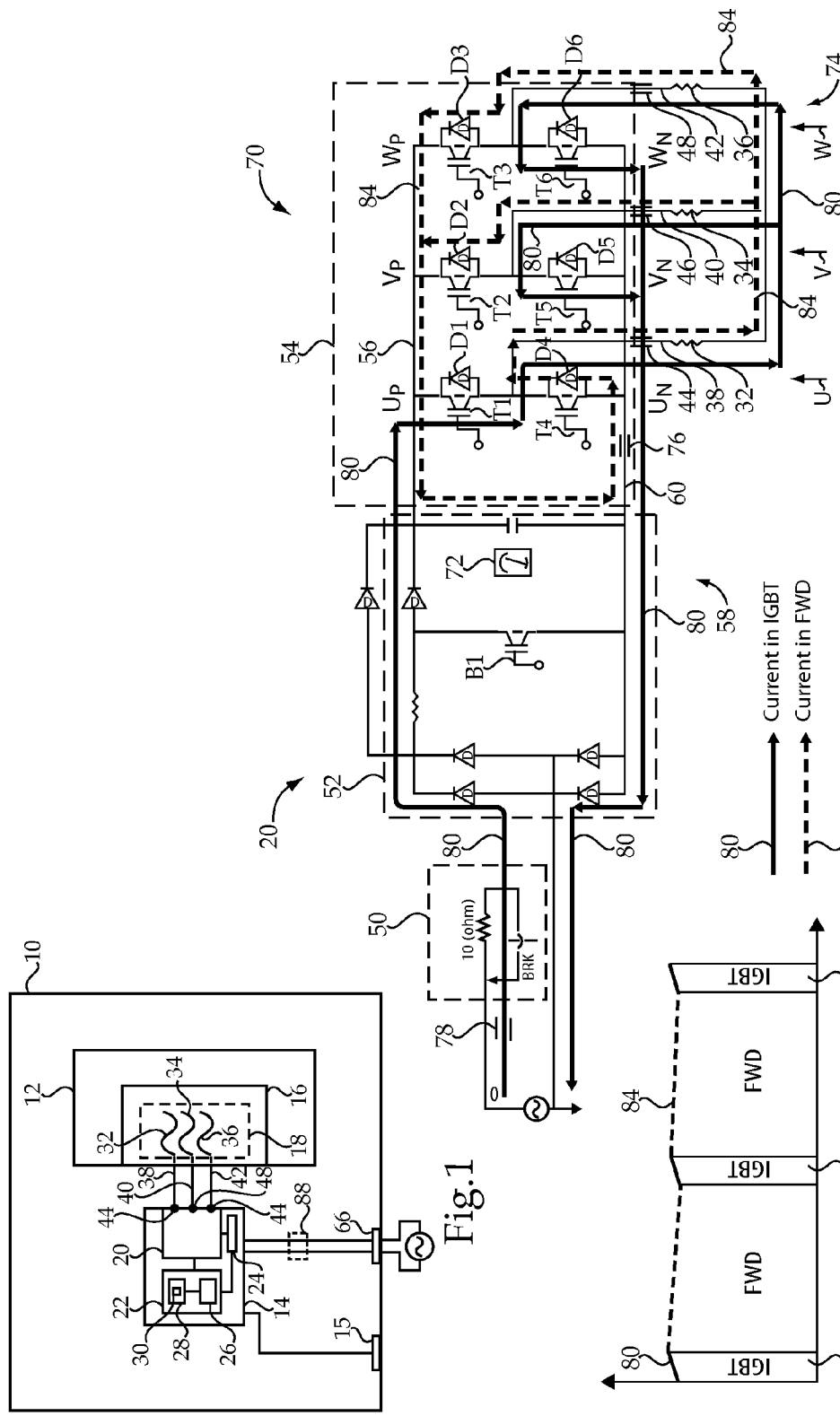
FIG. 1 schematically depicts some aspects of a non-limiting example of a refrigeration system in accordance with one embodiment.
FIGS. 2A and 2B depict some aspects of a non-limiting example of an inverter drive and current flow through transistors and freewheeling diodes of the inverter drive during some example diagnostic test conditions in accordance with one embodiment.

With reference to FIG. 1, some aspects of one non-limiting example of a system 10 in accordance with one embodiment are schematically illustrated. In the illustrated form, system 10 is a refrigeration system, such as a heat pump, air conditioner or other type of refrigeration system. For the purpose of concisely describing an exemplary embodiment, system 10 is described in a particular form including a variable frequency drive structured to electrically drive a motor which is, in turn, structured to mechanically drive a refrigerant compressor. It shall be appreciated, however, that system 10 may be provided in a number of different forms. Further exemplary forms for system 10 include, for example, variable frequency drives structured to electrically drive motors that are, in turn, structured to drive condenser fans, cooling fans, blower fans, ventilation fans, air compressors, other types of fans, other types of compressors, or other types of mechanical loads. It shall further be appreciated that the additional aspects and embodiments disclosed herein, including those described in connection with FIGS. 2-6, may also be utilized in connection with systems having any of these different forms.

With continuing reference to FIG. 1, system 10 includes a refrigeration system 12 and a control system 14 configured to operate refrigeration system 12. Refrigeration system 12 includes a compressor 16 powered by a motor 18, which may be integral with compressor 16. Control system 14 includes an inverter 20, a processor system 22 and a gate drive 24 configured to operate inverter 20. In various embodiments, inverter 20, processor system 22 and gate drive 24 may be co-located, e.g., on the same circuit board, or may be distributed across various locations within control system 14.

Processor system 22 is communicatively coupled to inverter 20 and to gate drive 24. In one form, controller 26 is microprocessor based and diagnostic test algorithm 30 is in the form of program instructions in the form of software stored in a non-transitory computer memory medium 28. However, it is alternatively contemplated that the controller and program instructions may be in the form of any combination of software, firmware and hardware, including state machines, and may reflect the output of discreet devices and/or integrated circuits, which may be co-located at a particular location or distributed across more than one location, including any digital and/or analog devices configured to achieve the same or similar results as a processor-based controller executing software, firmware and/or hardware based instructions.

Gate drive 24 is communicatively coupled to inverter 20. Gate drive 24 is configured to control the operations of the transistors, e.g. phase leg and booster transistors, of inverter 20, e.g., under the direction of processor system 22. Processor system 22 includes a controller 26 and a memory 28 that stores, among other things, a diagnostic test algorithm 30 configured for performing diagnostic testing of inverter 20, windings 32, 34 and 36 of motor 18, and leads or lead wires 38, 40 and 42. Leads 38, 40 and 42 are electrically coupled to windings 32, 34 and 36 respectively, and are electrically coupled to U, V and W phases of inverter 20. Phase current sensors 44, 46 and 48 are configured to sense the current flowing into/out of leads 38, 40 and 42, respectively.

Referring to FIG. 2A, some aspects of a non-limiting example of inverter 20 are schematically depicted in accordance with one embodiment. Inverter 20 includes an inrush control circuit 50, a power factor correction (PFC) circuit 52 and an inverter 54. Inrush control circuit 50 may take any of a plurality of forms. In the example illustrated in FIG. 2A, a resistor, e.g., 10 ohm resistor, and a relay such as breaker BRK are employed. In one form, the breaker is a normally-open relay (defaults to the open position when not supplied with power), and is controlled by controller 24. While connecting to Utility, BRK is open, thereby shunting current flow through the 10 ohm resistor and limiting inrush current. During normal motor operation, BRK is closed, thereby bypassing the 10 ohm resistor and allowing unrestricted current flow through the inrush control circuit. PFC circuit 52 may take any one of a plurality of forms, only one of which is illustrated in FIG. 2A. In one implementation, during certain operating modes, PFC circuit 52 may boost the voltage across the DC bus from approximately 320 V to approximately 425 V it being appreciated that a variety of other voltages and boosted voltages are also contemplated.

Inverter 54 includes U, V and W phases coupled to windings 32, 34 and 36, respectively, via leads 38, 40 and 42 respectively. The U phase includes a Up leg having a transistor T1 and a freewheeling diode D1; a Un leg having a transistor T4 and a freewheeling diode D4; a Vp leg having a transistor T2 and a freewheeling diode D2; a Vn leg having a transistor T5 and a freewheeling diode D5; includes a Wp leg having a transistor T3 and a freewheeling diode D3; and a Wn leg having a transistor T6 and a freewheeling diode D6. The Up, Vp and Wp legs are coupled to the positive side 56 of a DC bus 58, and the Un, Vn and Wn legs are coupled to the negative side 60 of DC bus 58. In one form, each of transistors T1-T6 is an IGBT. In other embodiments, one or more of transistors T1-T6 may take another form e.g. a power MOSFET.

System 10 includes a diagnostic system configured to perform diagnostic testing to determine the occurrence of fault conditions of various portions of inverter 20; windings 32, 34 and 36; and leads 38, 40 and 42. In one form, diagnostic system includes diagnostic test algorithm 30, phase current sensors 44, 46 and 48, and a voltage transducer 72. In some embodiments, diagnostic system may include other components, for example and without limitation, an overcurrent detection apparatus 74, a current sensor 76 disposed on DC bus 58 adjacent to inverter 54, and/or a current sensor 78, e.g., disposed upstream of inrush control circuit 50 or downstream of inverter 54. In one form, overcurrent detection apparatus 74 is made up of phase current sensors 44, 46 and 48. In other embodiments, overcurrent detection apparatus 74 may take other forms. For example, in some embodiments, overcurrent detection apparatus 74 may consist of or employ current sensor 78. In other embodiments, overcurrent detection apparatus 74 may be, for example and without limitation an overcurrent protection/trip device 88, e.g., located between the power input 66 to system 10 and inverter 20 or another control system 14 component, on inverter 20 or any suitable location in or on system 10.

Figure 3:
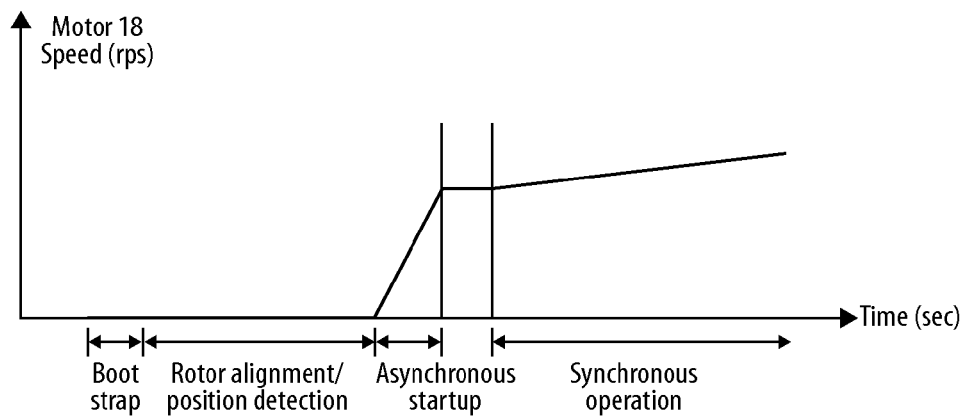
FIG. 3 depicts some aspects of a non-limiting example of the startup operation of an inverter driven motor in accordance with one embodiment.

In one form, diagnostic test algorithm 30 is run if overcurrent protection is triggered a predetermined number of times before asynchronous starting, e.g., as illustrated in FIG. 3. The number of predetermined times may vary with the needs of the particular application, for example, and may be a single overcurrent event or any number of overcurrent events. In one form, diagnostic test algorithm is initiated by a service technician. In other embodiments, diagnostic test algorithm 30 may be auto-initiated if the predetermined overcurrent condition is detected by overcurrent detection apparatus 74, e.g., phase current sensors 44, 46 and 48. In one example, the current injected into inverter 20 is 15 A. The current measured at each of phase current sensors 44, 46 and 48 is compared to a threshold. If the measured current exceeds the threshold, the occurrence is designated as an overcurrent condition.

Figure 4:
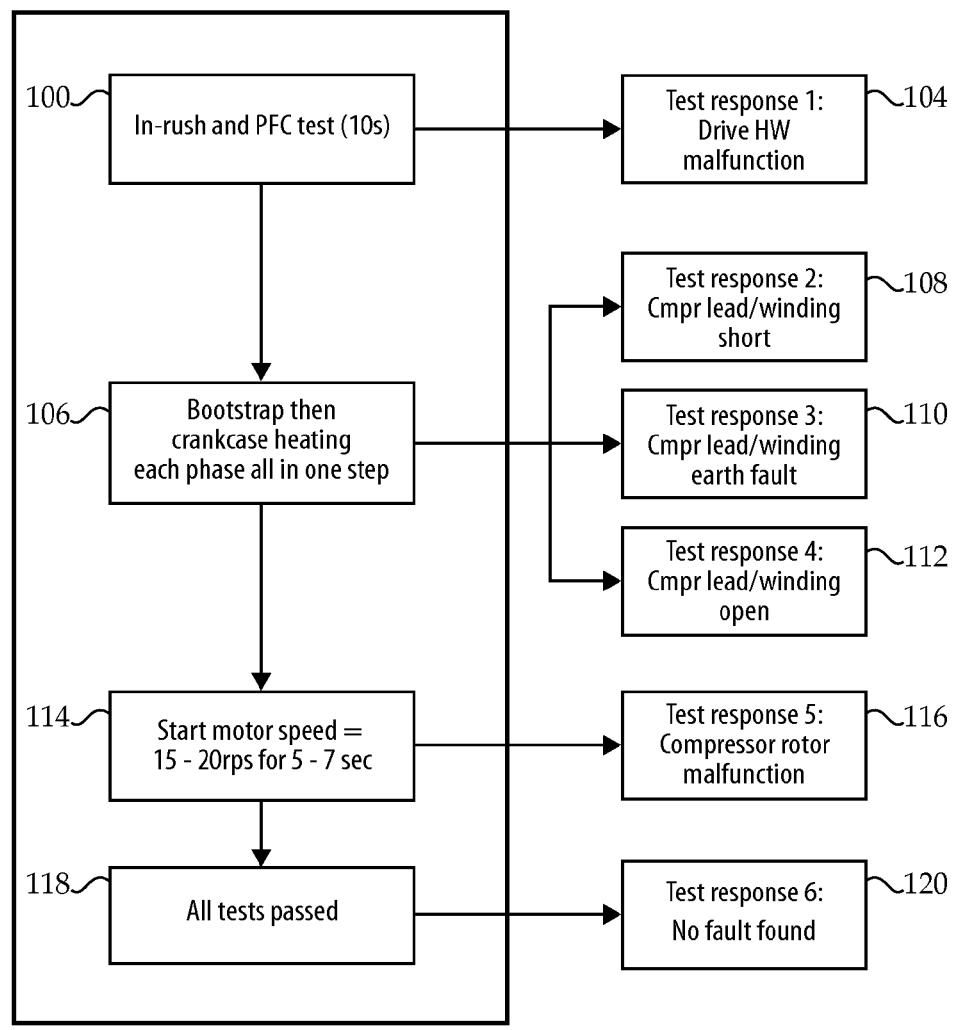
FIG. 4 depicts some aspects of a non-limiting example of some steps performed as part of a diagnostic test in accordance with one embodiment.

Referring to FIG. 4, examples of actions performed under the diagnostic test procedure executed by diagnostic test algorithms 30, along with example test responses are illustrated. Motor 18 may remain connected to inverter 20 during the diagnostic testing. In one form, if a diagnostic test action results in a negative result, i.e., a fault, the diagnostic test is terminated and the fault is indicated via a display 15, e.g. for use by a service technician servicing system 10. In other embodiments, the diagnostic test may continue to its completion, e.g., assuming that the completion of the diagnostic test is not prevented by one or more failed components. In the present description, a fault detected by diagnostic test algorithm 30 as well as lack of fault, may be referred to as a test response. In the example described herein, six test responses are described, five of which indicate particular faults and one of which indicates that no faults were detected. Display 15 displays the test response. Display 15 may take any suitable form, such as for example an LED or LCD display.

At operation 100, and inrush and PFC test is performed. During the inrush and PFC test, the relay of the inrush control circuit 50 is closed and the PFC circuit 52 is activated to boost the voltage across the DC bus 58. In this state the voltage across DC bus 58 is measured, e.g., by voltage transducer 72 coupled to positive rail 56 and negative rail 60, respectively, of DC bus 58. If the voltage across the DC bus is below a predetermined threshold, this condition is designated as a failure or malfunction of the drive hardware, e.g., a failure of the of the PFC circuit, the inrush control circuit or drive hardware circuitry connected thereto.

Test response variable 104 is set to an error state and may subsequently be utilized to provide an output indication that a drive hardware (HWM) malfunction has occurred. On this basis, a technician servicing system 10 may be informed that the drive is to be replaced.

At operation 106, a bootstrap test procedure is performed followed by a crankcase heating test procedure. In an exemplary embodiment, the bootstrap test procedure implements the inverter switch control logic signals illustrated in FIG. 6 in which each one of a plurality of switches (e.g. transistors) of the inverter is turned on while the other switches are turned off. In the illustrated embodiment each of transistors T1-T6 is turned one at a time as denoted by the ordered sequence of square pulse for turning on the transistors corresponding to Un, Vn, Wn, Up, Vp, Wp. If any of the transistors has experienced a short circuit failure, unrestricted current will flow through the inverter leg when a second transistor on that leg is turned on. This current flow is effective to destructively disable the inverter by destroying the transistors or other electronics in the current path. It is not necessary to set a separate error code (although this may optionally be done, e.g., by detecting an over current condition) since the destructive disabling event typically produces operator-perceptible phenomena, for example, the presence of smoke, noise and/or odor from the destructive event.

The crankcase heating test procedure includes sequentially turning on a high side switch and turning off a low side switch coupled with each phase of the motor while concurrently turning off the high side switches of the other phases and turning on the low side switches of the other phases. An example at a certain point in this operation is illustrated in FIG. 2A where in the injected current 80 (Current in IGBT) is provided to transistor T1 which is turned on, flows through the motor winding and lead connected to the U phase and then in parallel through the motor windings and leads connected to the V and W phase, flows through transistors T5 and T6 which are turned on, and to the negative rail of the DC bus. In order to verify all of the phases, the on and off states of the transistors may be sequentially repeated or cycled through each of the permutations including one high transistor turned on, two low side transistors on other legs turned on and all other transistors turned off. Thus, for example, a first transistor state may have T1=ON, T2=OFF, T3=OFF, T4=OFF, T5=ON, and T6=ON with a current injected to T1; a second transistor state may have T1=OFF, T2=ON, T3=OFF, T4=ON, T5=OFF, and T6=ON with a current injected to T2; and a third transistor state may have T1=OFF, T2=OFF, T3=ON, T4=ON, T5=ON, and T6=OFF with a current injected to T3.

The crankcase heating test procedure further includes evaluating a current for the phases coupled to a transistor that is turned on, e.g., using the phase current sensors described herein, and selectively setting one or more diagnostic codes based on this evaluation. Test response variable 108 may be set to indicate a line-to line short circuit condition in the lead or motor winding, i.e., an internal short if an over current condition is evaluated for two of the motor phases. In this case subsequent separate measurements, e.g., using a multimeter, may be performed by the service technician in order to determine whether the short circuit is in one or more of the motor leads or one or more of the windings. Test response variable 110 may be set to indicate an earth fault condition if an over current condition is detected for only one of the motor phases. Test response variable 112 may be set to indicate an open circuit condition of a lead or motor winging is an under current condition (e.g., a zero current or a current below a non-zero threshold) is evaluated for one or more motor phases.

An output indicating the occurrence of Test Response 2, Test Response 3 and/or Test Response 4 is displayed on display 15 based upon the test response variables 104 108, 110 and 112. It shall be appreciated that the output diagnostic information provided by distinguishing between a malfunction of the variable frequency drive (i.e., Test response 2 in response to test response variable 104) and a malfunction of the motor, the compressor or the electrical connector (i.e. any of Test Responses 2, 3,4, and 5 in response to test response variables 108, 110, 112, and 116). It shall further be appreciated that test response variables 108, 110, 112, and 116 may be used to further distinguish among failure modes by respectively indicating a lead-to-lead short of the compressor motor or lead, an earth fault of the compressor motor or lead, an open circuit fault of the compressor motor or lead, or a mechanically obstructed compressor or other mechanical load driven by the motor.

It shall further be understood that the crankcase heating test procedure also causes the heating of the motor crankcase from which the test procedure derives its name. Under some conditions, it is desirable to confirm that pre-heating of compressor 16 is functional, and/or to preheat compressor 16 in order to vaporize and remove refrigerant liquid therefrom. In one form, current is injected into one phase e.g. the U phase, which is returned through the V and W phases. In one such operating state, a known current is injected with transistors T1, T5 and T6 turned on resulting in the current 80 and, when the transistors turned off a second current flow 84 (current in FWD) may recirculate through freewheeling diodes connected in parallel to respective ones of transistors T1-T6. This causes heating in motor 18, hence compressor 16, to thereby vaporize and remove refrigerant liquid from compressor 16.

At operation 114, a rotor malfunction test e.g. a compressor rotor malfunction test is performed by control system 14 commanding a relatively low motor 18 speed, and determining whether motor 18 is rotating. Rotation may be determined for example by commanding motor operation at a predetermined speed, determining an actual speed of the motor or its load, evaluating a difference between the commanded speed and the determined speed, and setting an error condition based upon that difference exceeding a threshold or a range. Rotation may also be determined for example by sensing current using one of the described current sensors or for example by measuring compressor electrical speed, e.g., using a Luenberger observer algorithm. The occurrence of zero rotation or rotation below a desired threshold is designated as a rotor malfunction, and Test Response 5 is displayed on display 15 at operation 116. At operation 118, if no error conditions were indicated during testing, Test Response 6 is displayed on display 15 at operation 120.

In some embodiments, a test mode is provided on a variable frequency drive that verifies the condition of the drive, the connection to the load, and the connected load autonomously by performing a known sequence of control events. At the conclusion of the test sequence, the source of the problem is reported. Certain embodiments provide a "1-button" solution to a service technician to enable them to verify the condition of the invertor drive, wiring, and compressor. By activation of the device via an on-board interface in a matter of a few seconds a series of test steps will be performed and a succinct and clear message will be displayed to the technician indicating if the drive is faulted or not. In FIG. 4 the steps involved in the drive diagnostic test are shown in flow chart form. In addition, the results that are reported out are shown for each test step. The drive diagnostic test may be part of entire troubleshooting procedure that will include running the test, interpreting the results, and taking corrective action.

Figure 5:
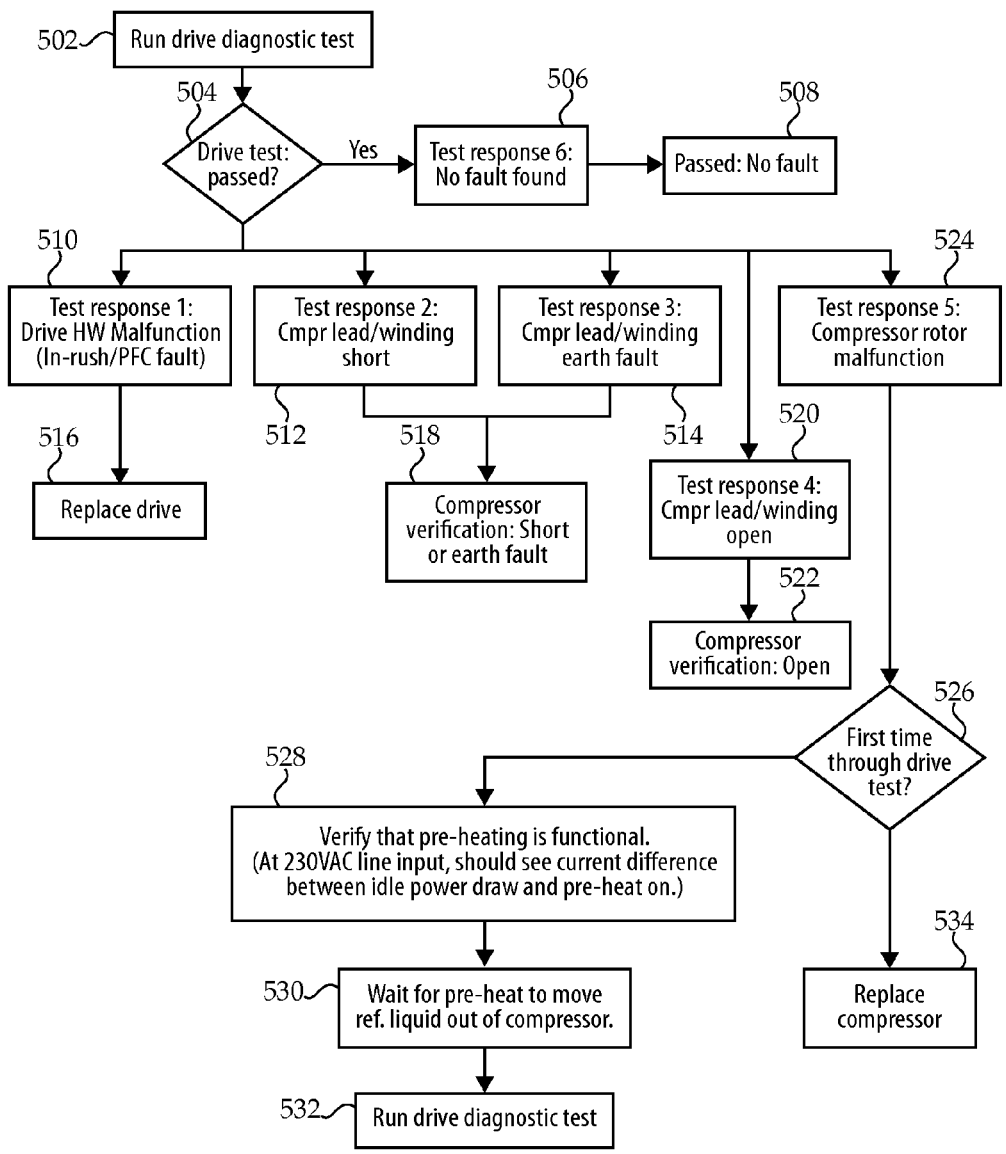
FIG. 5 depicts some aspects of a non-limiting example of a flow chart illustrating diagnostic testing in accordance with one embodiment.
Figure 6:
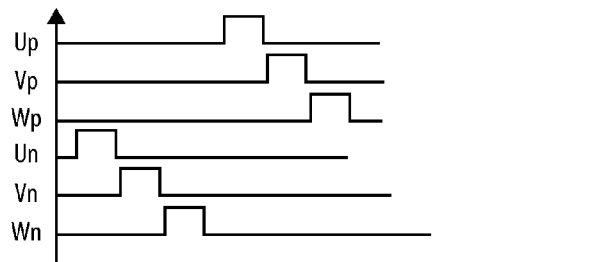
FIG. 6 depicts some aspects of a non-limiting example of a bootstrap test sequence in accordance with one embodiment.

FIG. 5 illustrates an example of how the drive diagnostic test provides outputs useful in connection with a service technician's troubleshooting process. At operation 502 a technician initiates a diagnostic test procedure. Conditional 504 determines if the test procedure passes. If yes, test response 506 is set indicating no fault found, and an output 508 is provided indicating that no corrective action is needed. If no, one of test response variables 510, 512, 514, 520, and 524 is set indicating the various fault conditions described herein above. If test response variable 510 is set, an output 516 is provided indicating a drive failure and/or prompting replacement of the drive. If test response variable 512 or 514 is set, an output 518 is provided indicating that a lead or compressor short or earth fault is present and/or prompting replacement of the compressor motor or lead. If test response variable 520 is set, an output 522 is provided indicating that a compressor or lead open circuit condition is present and/or prompting replacement of the compressor motor or lead.

If test response variable 524 is set, conditional 526 checks whether the test has been repeated more than once. If the test has been repeated more than once output 534 is provided to prompt replacement of the compressor unit (which may or may not include the motor). If the test has not been repeated more than once, operation 528 is performed to verify that the pre-heating operation is functional (e.g., at 230 VAC line input the operation should see a current difference between idle and pre-heat conditions). Pre-heating operation 530 is then performed for a period sufficient to boil off refrigerant that has collected in the compressor. Operation 532 is then performed which repeats the foregoing diagnostic steps.

Several further exemplary embodiments shall now be described. One further exemplary embodiment is a diagnostic method for a system comprising a variable frequency drive, a motor structured to drive a mechanical load, a connector electrically coupling the variable frequency drive and the motor, and a controller structured to control operation of the variable frequency drive, the variable frequency drive including an inrush relay and a power factor correction (PFC) circuit operatively coupled with a DC bus and an inverter operatively coupled with the DC bus and the motor. The method comprises performing a first procedure with the controller including first evaluating a voltage of the DC bus after closing the inrush relay and activating the PFC circuit and setting a value of a first diagnostic code based upon the first evaluating; performing a second procedure with the controller including sequentially turning on each one of a plurality of switches of the inverter while concurrently turning off each other switch of the inverter; performing a third procedure with the controller including injecting a current to one of the plurality of switches of the inverter which is turned on, second evaluating a current of at least one phase of the motor, and setting a value of at least one additional diagnostic code based upon the second evaluating; outputting first diagnostic information indicating a malfunction of the variable frequency drive if the value of a first diagnostic code indicates an error; and outputting second diagnostic information indicating a malfunction of the motor or the connector if the value of the at least one additional diagnostic code indicates an error.

In certain forms the act of performing the second procedure is effective to destructively disable at least a portion of the inverter if one of the plurality of switches is shorted. In certain forms the outputting first diagnostic information and the outputting second diagnostic information comprise providing output to a visual display. In certain forms the at least one additional diagnostic code comprises a second diagnostic code for a line-to-line short condition of the connector or the motor, a third diagnostic code for an earth fault condition of the connector or the motor, and a fourth diagnostic code for an open circuit condition of the connector or the motor. In certain forms the motor is a three phase motor, the inverter includes a plurality of high side switches coupled with respective phases of the motor and a corresponding plurality of low side switches coupled with the respective phases of the motor, and the act of performing a third procedure comprises sequentially turning on a high side switch and turning off a low side switch coupled with each phase of the motor while concurrently turning off the high side switches of the other phases and turning on the low side switches of the other phases, injecting a current to the high side switch which is turned on, evaluating a current for each of the phases coupled to the low side switches which are turned on, setting the value of the second diagnostic code to indicate an error if an over-current condition is evaluated for two of the motor phases, setting the value of the third diagnostic code to indicate an error if an over-current condition is evaluated for only one of the motor phases, and setting the value of the fourth diagnostic code to indicate an error if an under current condition is detected for at least one of the motor phases. Certain forms further comprise performing a fourth procedure including operating the drive to rotate the motor at a predetermined speed, third evaluating an actual speed of the motor, and setting a value of a fifth diagnostic code based upon the third evaluating. In certain forms the mechanical load driven by the motor comprises a compressor structured to compress a refrigerant.

One further exemplary embodiment is a system comprising a variable frequency drive comprising an inverter including a plurality of switching devices, a DC bus coupled with the inverter, a voltage booster circuit coupled with the DC bus, and a relay coupled with the DC bus and a line input; a motor structured to drive a mechanical load; an electrical connector coupling the variable frequency drive and the motor; and a controller structured to set a first diagnostic code based upon a voltage of the DC bus when the relay is closed and the voltage booster circuit is activated, sequentially turn on each one of the switching devices of the inverter while concurrently turning off each of the other switching devices, set at least one additional diagnostic code based upon a current of a motor phase during a current injection to the inverter, output a first error indication for the variable frequency drive if the first diagnostic code is set to an error state, and output a second error indication for the motor or the electrical connector if the at least one additional diagnostic code is set to an error state.

In certain forms the at least one additional diagnostic code comprises a second diagnostic code which is set to an error state if an over current condition is detected for two phases of the motor. In certain forms the at least one additional diagnostic code comprises a third diagnostic code which is set to an error state if an over current condition is detected for only one phase of the motor. In certain forms the at least one additional diagnostic code comprises a fourth diagnostic code which is set to an error state if no current is detected in at least one phase of the motor. In certain forms the controller is configured to set a fifth diagnostic code based upon a relationship between a motor speed and a commanded motor speed. In certain forms the controller is structured to start and operate the motor and the variable frequency drive in a synchronous mode if none of the first, second, third, fourth or fifth diagnostic codes is set to an error state. In certain forms the electrical connector comprises a wiring harness. In certain forms the mechanical load comprises a rotatable load of a refrigeration system.

One further exemplary embodiment is a system comprising a variable frequency drive; a motor structured to drive a mechanical load; an electrical connector coupling the variable frequency drive and the motor; and a controller structured to control operation of the variable frequency drive; wherein the controller is structured to set a first diagnostic code based upon a condition of a DC bus of the variable frequency drive during a first state of the variable frequency drive, set at least one other diagnostic code based upon a condition of a motor current during a second state of the variable frequency drive, and output diagnostic information distinguishing between a malfunction of the variable frequency drive and a malfunction of a motor or the electrical connector based upon the setting of the first diagnostic code and the setting of the at least one other diagnostic code.

In certain forms the controller is structured to set the first diagnostic code to indicate an error when a voltage of the DC bus is below a voltage threshold. In certain forms the first state of the variable frequency drive comprises a drive input relay being closed and a voltage booster being activated. In certain forms the condition of the motor current comprises at least one of an over current condition of at least one phase of the motor and an under current condition of at least one phase of the motor. In certain forms the second state of the variable frequency drive includes a current injection to an inverter leg of the variable frequency drive. In certain forms the at least one other diagnostic code comprises a second diagnostic code for a line-to-line short condition of the connector or the motor, a third diagnostic code for an earth fault condition of the connector or the motor, and a fourth diagnostic code for an open circuit condition of the connector or the motor. In certain forms the second diagnostic code is set to an error state if an over current condition is detected for two phases of the motor, the third diagnostic code is set to an error state if an over current condition is detected for only one phase of the motor, and the fourth diagnostic code is set to an error state if zero current is detected in at least one phase of the motor. In certain forms the mechanical load comprises one of a condenser fan and a refrigerant pump of an HVACR system.

While exemplary embodiments of the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

What is claimed is:

1. A diagnostic method for a system comprising a variable frequency drive, a motor structured to drive a mechanical load, a connector electrically coupling the variable frequency drive and the motor, and a controller structured to control operation of the variable frequency drive, the variable frequency drive including an inrush relay and a power factor correction (PFC) circuit operatively coupled with a DC bus and an inverter operatively coupled with the DC bus and the motor, the method comprising:
   performing a first procedure with the controller including first evaluating a voltage of the DC bus after closing the inrush relay and activating the PFC circuit and setting a value of a first diagnostic code based upon the first evaluating;
   performing a second procedure with the controller including sequentially turning on each one of a plurality of switches of the inverter while concurrently turning off each other switch of the inverter;
   performing a third procedure with the controller including injecting a current to one of the plurality of switches of the inverter which is turned on, second evaluating a current of at least one phase of the motor, and setting a value of at least one additional diagnostic code based upon the second evaluating;
   outputting first diagnostic information indicating a malfunction of the variable frequency drive if the value of a first diagnostic code indicates an error; and
   outputting second diagnostic information indicating a malfunction of the motor or the connector if the value of the at least one additional diagnostic code indicates an error.

2. The method of claim 1 wherein the act of performing the second procedure is effective to destructively disable at least a portion of the inverter if one of the plurality of switches is shorted.

3. The method of claim 1 wherein the outputting first diagnostic information and the outputting second diagnostic information comprise providing output to a visual display.

4. The method of claim 1 wherein the at least one additional diagnostic code comprises a second diagnostic code for a line-to-line short condition of the connector or the motor, a third diagnostic code for an earth fault condition of the connector or the motor, and a fourth diagnostic code for an open circuit condition of the connector or the motor.

5. The method of claim 4 wherein the motor is a three phase motor, the inverter includes a plurality of high side switches coupled with respective phases of the motor and a corresponding plurality of low side switches coupled with the respective phases of the motor, and the act of performing a third procedure comprises sequentially turning on a high side switch and turning off a low side switch coupled with each phase of the motor while concurrently turning off the high side switches of the other phases and turning on the low side switches of the other phases, injecting a current to the high side switch which is turned on, evaluating a current for each of the phases coupled to the low side switches which are turned on, setting the value of the second diagnostic code to indicate an error if an over-current condition is evaluated for two of the motor phases, setting the value of the third diagnostic code to indicate an error if an over-current condition is evaluated for only one of the motor phases, and setting the value of the fourth diagnostic code to indicate an error if an under current condition is detected for at least one of the motor phases.

6. The method of claim 1 further comprising performing a fourth procedure including operating the drive to rotate the motor at a predetermined speed, third evaluating an actual speed of the motor, and setting a value of a fifth diagnostic code based upon the third evaluating.

7. The method of claim 1 wherein the mechanical load driven by the motor comprises a compressor structured to compress a refrigerant.

8. A system comprising:
a variable frequency drive comprising an inverter including a plurality of switching devices, a DC bus coupled with the inverter, a voltage booster circuit coupled with the DC bus, and a relay coupled with the DC bus and a line input;
a motor structured to drive a mechanical load;
an electrical connector coupling the variable frequency drive and the motor; and
a controller structured to:
set a first diagnostic code based upon a voltage of the DC bus when the relay is closed and the voltage booster circuit is activated,
sequentially turn on each one of the switching devices of the inverter while concurrently turning off each of the other switching devices,
set at least one additional diagnostic code based upon a current of a motor phase during a current injection to the inverter,
output a first error indication for the variable frequency drive if the first diagnostic code is set to an error state, and
output a second error indication for the motor or the electrical connector if the at least one additional diagnostic code is set to an error state.

9. The system of claim 8 wherein the at least one additional diagnostic code comprises a second diagnostic code which is set to an error state if an over current condition is detected for two phases of the motor.

10. The system of claim 9 wherein the at least one additional diagnostic code comprises a third diagnostic code which is set to an error state if an over current condition is detected for only one phase of the motor.

11. The system of claim 10 wherein the at least one additional diagnostic code comprises a fourth diagnostic code which is set to an error state if no current is detected in at least one phase of the motor.

12. The system of claim 11 wherein the controller is configured to set a fifth diagnostic code based upon a relationship between a motor speed and a commanded motor speed.

13. The system of claim 12 wherein the controller is structured to start and operate the motor and the variable frequency drive in a synchronous mode if none of the first, second, third, fourth or fifth diagnostic codes is set to an error state.

14. The system of claim 8 wherein the electrical connector comprises a wiring harness.

15. The system of claim 8 wherein the mechanical load comprises a rotatable load of a refrigeration system.

16. A system comprising:
a variable frequency drive;
a motor structured to drive a mechanical load;
an electrical connector coupling the variable frequency drive and the motor; and
a controller structured to control operation of the variable frequency drive;
wherein the controller is structured to
set a first diagnostic code based upon a condition of a DC bus of the variable frequency drive during a first state of the variable frequency drive,
set at least one other diagnostic code based upon a condition of a motor current during a second state of the variable frequency drive, and
output diagnostic information distinguishing between a malfunction of the variable frequency drive and a malfunction of a motor or the electrical connector based upon the setting of the first diagnostic code and the setting of the at least one other diagnostic code.

17. The system of claim 16 wherein the controller is structured to set the first diagnostic code to indicate an error when a voltage of the DC bus is below a voltage threshold.

18. The system of claim 16 wherein the first state of the variable frequency drive comprises a drive input relay being closed and a voltage booster being activated.

19. The system of claim 16 wherein the condition of the motor current comprises at least one of an over current condition of at least one phase of the motor and an under current condition of at least one phase of the motor.

20. The system of claim 16 wherein the second state of the variable frequency drive includes a current injection to an inverter leg of the variable frequency drive.

21. The system of claim 16 wherein the at least one other diagnostic code comprises a second diagnostic code for a line-to-line short condition of the connector or the motor, a third diagnostic code for an earth fault condition of the connector or the motor, and a fourth diagnostic code for an open circuit condition of the connector or the motor.

22. The system of claim 21 wherein the second diagnostic code is set to an error state if an over current condition is detected for two phases of the motor, the third diagnostic code is set to an error state if an over current condition is detected for only one phase of the motor, and the fourth diagnostic code is set to an error state if zero current is detected in at least one phase of the motor.

23. The system of claim 16 wherein the mechanical load comprises one of a condenser fan and a refrigerant pump of an HVACR system.

* * * * *